Oct. 15, 1968 S. R. SHORTES 3,406,050

METHOD OF MAKING ELECTRICAL CONTACT TO A SEMICONDUCTOR BODY

Filed Aug. 4, 1965

Samuel R. Shortes
INVENTOR.

BY John G. Graham
ATTORNEY

United States Patent Office 3,406,050

Patented Oct. 15, 1968

3,406,050

METHOD OF MAKING ELECTRICAL CONTACT TO A SEMICONDUCTOR BODY

Samuel R. Shortes, Dallas, Tex., assignor to Texas Instruments Incorporated, Dallas, Tex., a corporation of Delaware Filed Aug. 4, 1965, Ser. No. 477,150
7 Claims. (Cl. 148—179)

This invention relates to contact materials for semiconductor devices. More particularly it relates to contact electrodes suitable for high temperature operation of a compound semiconductor device, and methods of making such electrodes.

One of the major advantages of wide band-gap semiconductor materials, such as gallium arsenide, is the capability to function as a semiconductor device at elevated temperatures. For example, it is known that gallium arsenide transistors can operate effectively at temperatures as high as 400° C. Even though gallium arsenide permits high temperature operation, however, this is no advantage if the electrodes or contact materials will not withstand such high temperatures. In other words, even though the body of the semiconductor device will function properly as a semiconductor device at elevated temperatures, the materials which form electrical contacts to the body will not function unless they too are capable of operating and performing the desired contact functions at the same elevated temperatures. Furthermore, the step of attaching electrodes to the semiconductor body must be compatible with other steps in the fabrication of the device.

In this respect, forming an emitter and emitter contact for an NPN gallium arsenide transistor has presented serious difficulties. Conventionally, the P-type base region of the transistor is formed by diffusing acceptor impurities into a portion of a body of N-type gallium arsenide adjacent one surface. Thereafter a donor material such as tin is alloyed to the P-type layer to form the emitter. The tin, in alloying with the P-type layer, dissolves a portion of the P-type layer which then recrystallizes on cooling to form a regrowth region of gallium arsenide which is saturated with tin. The regrowth region is thus highly doped N-type. This regrowth region constitutes the emitter of the NPN transistor. However, the tin contact is not suitable for a high temperature operation in the device since the tin will melt at approximately 232° C.

It is therefore an object of this invention to provide contact electrodes for semiconductor devices which will not impose limitations on the devices for high temperature operation. Another object is to provide contact electrodes from Group III–A—V–A compound semiconductor devices, particularly gallium arsenide, which permit high temperature operation but yet may be fabricated by conventional techniques, such as for example, by evaporation. Another object is to provide a method of forming an emitter and emitter contact for an NPN gallium arsenide transistor.

In accordance with the invention, NPN gallium arsenide transistors are formed by the diffusion of an acceptor impurity, such as cadmium, magnesium, manganese or zinc into the surface of a body of N-type gallium arsenide to form a P-type region. The P-type region is then suitably masked with a coating such as silicon oxide having a hole therein which exposes a portion of the P-type surface. A suitable donor impurity such as tin is then alloyed to the exposed P-type surface to form an N-type regrowth region therein. The remaining tin is then leached from the surface of the wafer leaving the N-type regrowth region exposed through the window in the mask. A high temperature stable contact material such as molybdenum (Mo) or tungsten (W) is then evaporated onto the surface exposed through the window and over part of the surface of the silicon oxide mask to provide a metal-over-oxide lead which is in ohmic contact with the N-type regrowth region, or emitter. By using the high temperature stable contact material as the electrode in ohmic contact with the regrowth region, low melting contact materials such as tin are eliminated from the device. Thus, the operation of the device is limited only by the temperature limitations of the semiconductor body and not by the electrode contact materials. Furthermore, the method of applying the high temperature stable contact material is compatible with conventional metal-over-oxide interconnection schemes and thus may be advantageously employed to interconnect a plurality of devices in a single semiconductor body. The evaporated contact material may also be advantageously employed as an expanded contact tab to which conventional electrodes such as gold wires may be conveniently bonded.

Other objects, features and advantages will be more readily understood from the following detailed description taken in connection with the appended claims and attached drawings in which:

Similar reference figures indicate corresponding parts throughout the several views of the drawing.

Although the invention may be employed advantageously in the production of high temperature stable contact structures in all Group III–A—V–A compound semiconductors, the following detailed description is in terms of an NPN gallium arsenide transistor for purposes of illustration.

Figure 1:
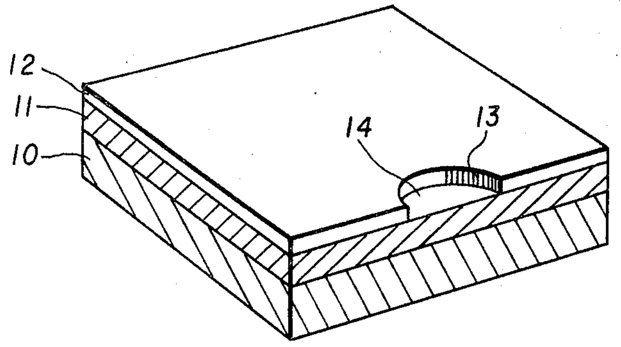
FIGURE 1 is a perspective view in section of a semiconductor wafer with a mask on one surface thereof.

With reference to FIGURE 1, a gallium arsenide wafer is shown having an N-type region 10 and a P-type region 11 formed adjacent thereto. The P-type layer 11 may be formed by any suitable conventional technique such as by diffusion of acceptor impurities into the surface of an N-type gallium arsenide wafer or by the epitaxial deposition of suitably doped P-type material. The P-type surface is then masked with a suitable protective coating 12 such as silicon oxide. A window 13 of the shape and size of the desired emitter is then formed in the oxide to expose a portion 14 of the surface of the P-type layer 11.

Figure 2:
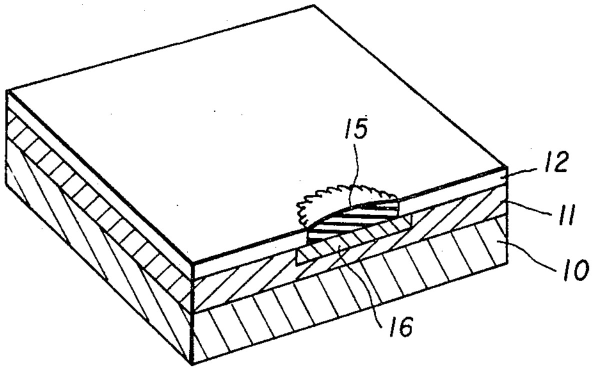
FIGURE 2 is a perspective view in section of the semiconductor wafer of FIGURE 1 with a contact alloyed thereto.

The emitter region 16, as shown in FIGURE 2, is formed by alloying a suitable donor impurity such as tin or alloys of Sn-Al or Sn-In in the form of a dot 15. The alloy dot 15 may be evaporated onto the exposed surface 14 or positioned thereon in the form of a small sphere. Upon heating the wafer to a temperature of about 500° C. or higher, the alloy dot 15 melts and dissolves the exposed surface 14. Upon cooling the dissolved semiconductor material recrystallizes to form a regrowth region 16 which is saturated with the constituents of the alloy dot 15. Thus the regrowth region is a recrystallized region of gallium arsenide saturated with tin and consequently heavily doped N-type. The excess alloy dot 15 remaining after the alloy step is removed by etching or leaching with a suitable solvent. Preferably the solvent used does not attack the semiconductor or the protective coating 12.

In the preferred method of practicing the invention, the wafer of FIGURE 2 is dipped in mercury. The liquid mercury amalgamates tin and indium, but does not attack gallium arsenide or silicon oxides. The leaching action of mercury thus removes all excess tin and tin alloys, but leaves the tin-saturated gallium arsenide regrowth region 16. The wafer of FIGURE 2 is shown in FIGURE 3 after the dot 15 has been leached away.

Figure 3:
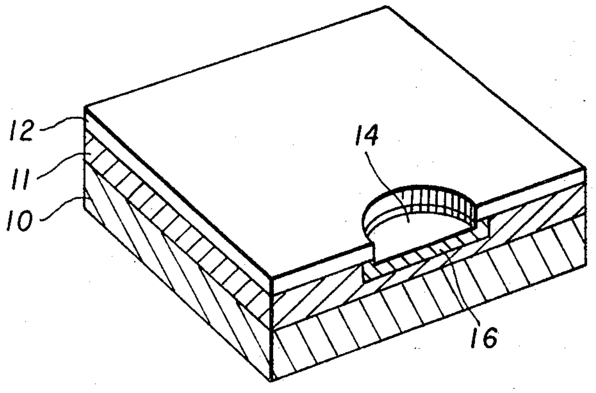
FIGURE 3 is a perspective view in section of the wafer of FIGURE 2 after the excess alloy contact has been removed.

It will be noted that the wafer of FIGURE 3 is comprised of an N-type layer 10, a P-type layer 11 and a heavily doped N-type regrowth region 16. Each of these regions of the gallium arsenide wafer are appropriately doped to provide the electrical characteristics for the collector, base and emitter, respectively, of a transistor.

Figure 4:
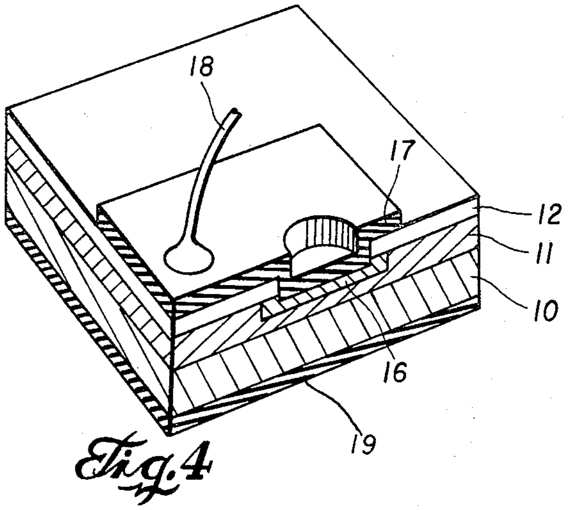
FIGURE 4 is a perspective view partially in section of a high temperature transistor fabricated from the wafer of FIGURE 3.

In order for the structure of FIGURE 3 to be operated as a gallium arsenide transistor, suitable electrical contact must be made to each of the regions 10, 11 and 16. The preferred method of making contact to the emitter region 16 is shown in FIGURE 4. Many of the refractory metals such as the Group VB metals; chromium, molybdenum and tungsten, form satisfactory ohmic connection with highly-doped N-type gallium arsenide.

Due to the high melting point and low vapor pressures of the refractory metals, very high temperatures must be attained to cause appreciable vaporization of the metals. However, since only small amounts of the refractory metals are required to effect the desired contact strips, satisfactory evaporation can be achieved by passing high currents through small wires of the contact material. The refractory metals may also be vaporized by electron beam vaporization.

The refractory metal may be evaporated through a suitable metal evaporation mask to form contact 17, connected with external conductor 18, as shown in FIGURE 4. During the evaporation, the surface of the wafer is masked so that the exposed surface of the gallium arsenide 14 is exposed through the metal evaporation mask and a part of the adjacent surface of the silicon oxide coating 12 in also exposed. Thus, the evaporated contact is in electrical contact with the exposed surface of the gallium arsenide 14, and extends over a defined portion of the silicon oxide coating forming an expanded contact. It will be noted that the metal contact 17 is electrically separated from the gallium arsenide body except in the area defined by the window 13, by the silicon oxide coating 12.

Similar contacts (not shown) may be made to the base layer 11. Small amounts of acceptor impurities, such as zinc, cadium, or manganese may be evaporated simultaneously with the refractory metal to assure the formation of an ohmic contact to the P-type base layer 11 without appreciably altering the melting point of the contact material. The wafer may then be attached to a collector tab 19 or alloyed directly to the surface of a suitable header. In this manner, the gallium arsenide transistor as depicted in FIGURE 4, is comprised of gallium arsenide having all contacts thereto formed of metals which have higher melting points than the highest operating temperature of gallium arsenied.

It is to be understood that other methods of removing the excess material of the emitter dot may be employed. For example, when the emitter is formed by alloying a dot of tin into the gallium arsenide wafer surface exposed through window 13, hydrochloric acid (HCl) may be used to selectively remove the excess tin from the gallium arsenide wafer. The choice of etching or leaching agent will, of course, be determined by its chemical reactivity in relation to the material used for the protective coating 12 and the material of the semiconductor substrate.

It should also be understood that the invention is not limited to the use of a single Group VB element for the contact material. Other materials with high melting points, such as nickel, or alloys having high melting points such as the alloy known under the trademark of "Kovar" which is comprised of a major proportion of iron and minor proportions of nickel and cobalt may also be used.

Although the invention has been described in terms of an emitter contact for a high temperature gallium arsenide transistor, it is to be understood that the method described herein may be advantageously used on other materials and other devices. For example, the contact may be advantageously employed as a high temperature contact to a diode, tunnel diode or other device. Furthermore, the resultant structure may be advantageously employed for interconnection of networks of devices by metal-over-oxide interconnections such as are commonly used in monolithic integrated circuit networks.

Other advantages and features of the invention will become readily apparent to those skilled in the art. It is to be understood that the form of this invention herewith shown and described is to be taken as a preferred example of the same and that various changes may be resorted to without departing from the spirit and scope of the invention as defined by the appended claims.

What is claimed is:

1. The method of making an emitter and emitter contact electrode on an NPN gallium arsenide transistor comprising the steps of:

(a) coating the P-type surface of a body of gallium arsenide comprised of contiguous regions of N- and P-type conductivity material with a protective film;
(b) forming a window in said coating;
(c) alloying a donor material to the P-type conductivity surface exposed through said window, thereby forming an N-type regrowth region in said exposed P-type surface;
(d) removing substantially all of said donor material which is not included in said regrowth region; and
(e) selectively evaporating a metal contact material to electrically engage said regrowth region and extend over part of the surface of said coating.

2. The method of claim 1 wherein said metal contact material is a material selected from the groups consisting of tungsten, molybdenum, chromium and nickel.

3. The method of making a high temperature stable electrical contact to a body of Group III–A—V–A compound semiconductor material comprising the steps of:

(a) coating at least a portion of the surface of said body with a protective film;
(b) forming an aperture in said protective film, thereby exposing a portion of said surface;
(c) placing a donor material in contact with the surface exposed through said aperture;
(d) heating said body to a temperature sufficient to cause said donor material to alloy with said surface exposed through said aperture;
(e) cooling said body, thereby causing said alloy to form a regrowth region;
(f) removing unalloyed donor material from the surface of said regrowth region; and
(g) selectively evaporating molybdenum onto the exposed surface of said regrowth region.

4. The method of making a high temperature stable electrical contact to a body of Group III–A—V–A compound semiconductor material comprising the steps of:

(a) coating at least a portion of the surface of said body with a protective film;
(b) forming an aperture in said protective film, thereby exposing a portion of said surface;
(c) placing a donor material in contact with the surface exposed through said aperture;
(d) heating said body to a temperature sufficient to cause said donor material to alloy with said surface exposed through said aperture;
(e) cooling said body, thereby causing said alloy to form a regrowth region;
(f) removing unalloyed donor material from the surface of said regrowth region; and
(g) selectively evaporating tungsten onto the exposed surface of said regrowth region.

5. The method of making an emitter and emitter contact electrode of an NPN gallium arsenide transistor comprising the steps of:

(a) coating the P-type surface of a body of gallium arsenide comprised of contiguous regions of N- and P-type conductivity material with silicon oxide;
(b) forming an aperture in said coating;
(c) alloying tin or alloys of tin and aluminum or alloys of tin and indium to the P-type conductivity surface exposed through said aperture, thereby forming an N-type regrowth region in said exposed P-type conductivity surface;
(d) removing substantially all of the tin or alloys of tin and aluminum or alloys of tin and indium which is not included in said regrowth region; and
(e) selectively evaporating molybdenum over the exposed surface of the regrowth region and part of the surface of said coating.

6. The method of making a high temperature stable electrical contact to a body of gallium arsenide comprising the steps of:
(a) coating at least a portion of the surface of said body with a film of silicon oxide;
(b) forming an aperture in said film of silicon oxide;
(c) placing a donor material in contact with the surface exposed through said aperture;
(d) heating said body to a temperature sufficient to cause said donor material to alloy with said surface exposed through said aperture;
(e) cooling said body, thereby causing said alloy to form a regrowth region;
(f) removing unalloyed donor material from the surface of said regrowth region; and
(g) selectively evaporating a material selected from the group consisting of molybdenum, tungsten, nickel, and Kovar onto the exposed surface of said regrowth region.

7. The method of making a high temperature stable electrical contact to a body of gallium arsenide comprising the steps of:
(a) coating at least a portion of the surface of said body with a film of silicon oxide;
(b) forming an aperture in said film of silicon oxide;
(c) placing an acceptor material in contact with the surface exposed through said aperture;
(d) heating said body to a temperature sufficient to cause said acceptor material to alloy with said surface exposed through said aperture;
(e) cooling said body, thereby causing said alloy to form a regrowth region;
(f) removing unalloyed acceptor material from the surface of said regrowth region; and
(g) selectively evaporating a material selected from the group consisting of molybdenum, tungsten, nickel, and Kovar onto the exposed surface of said regrowth region.

References Cited

UNITED STATES PATENTS

| | | | |
|---|---|---|---|
| 3,323,956 | 6/1967 | Gee | 148—185 |
| 3,345,216 | 10/1967 | Rogers | 148—1.5 |
| 3,349,474 | 10/1967 | Rauscher | 148—1.5 |
| 3,354,365 | 11/1967 | Belasco et al. | 148—179 |

RICHARD O. DEAN, *Primary Examiner.*